United States Patent [19]
Wong et al.

[11] Patent Number: 5,173,756
[45] Date of Patent: Dec. 22, 1992

[54] TRENCH CHARGE-COUPLED DEVICE

[75] Inventors: Hon-Sum P. Wong, Peekskill; Ying L. Yao, Millwood, both of N.Y.

[73] Assignee: International Business Machines Corporation, Armonk, N.Y.

[21] Appl. No.: 698,361

[22] Filed: May 8, 1991

Related U.S. Application Data

[63] Continuation of Ser. No. 461,607, Jan. 5, 1990, abandoned.

[51] Int. Cl.$^5$ .................... H01L 29/78; H01L 27/12; H01L 29/06
[52] U.S. Cl. .................... 257/243; 257/244; 257/249
[58] Field of Search ............ 357/24, 24 LR, 55, 47, 357/50, 49

[56] References Cited

U.S. PATENT DOCUMENTS

| | | | |
|---|---|---|---|
| 3,848,328 | 11/1974 | Ando et al. | 357/24 |
| 4,106,046 | 8/1978 | Nathanson et al. | |
| 4,173,765 | 11/1979 | Heald et al. | |
| 4,234,887 | 11/1980 | Vanderslice, Jr. | |
| 4,760,273 | 7/1988 | Kimata | |
| 4,814,843 | 3/1989 | Nishizawa | |
| 4,878,102 | 10/1989 | Bakker et al. | 357/24 |
| 5,055,900 | 10/1991 | Fossum et al. | 357/24 |

FOREIGN PATENT DOCUMENTS

| | | | |
|---|---|---|---|
| 52-60575 | 5/1977 | Japan | 357/24 |
| 55-1135 | 1/1980 | Japan | 357/24 |
| 55-56660 | 4/1980 | Japan | 357/24 |
| 56-13769 | 2/1981 | Japan | 357/24 |
| 58-46871 | 10/1983 | Japan | 357/24 |
| 63-12162 | 1/1988 | Japan | 357/24 |

OTHER PUBLICATIONS

Liw, "V-Grooved Charge-Coupled Device", IBM Technical Disclosure Bulletin, vol. 20, No. 11, Mar. 1978.

Fossum, "A Novel Trench-Defined Misim CCD Structure for X-ray Imaging and Other Applications," *IEEE Electron Device Letters*, vol. 10, No. 5, May 1989.

Primary Examiner—Andrew J. James
Assistant Examiner—Ngan Van Ngo
Attorney, Agent, or Firm—Scully, Scott, Murphy & Presser

[57] ABSTRACT

A charge-coupled device having a three-dimensional trench structure that achieves a highly effective sensing and storage area in a CCD imager while maintaining a small cell layout area. The trench CCD device includes a plurality of trench electrodes etched in the surface of the device, with surface electrodes in between. The trenches are shaped to facilitate charge transfer along their sidewalls and to maximize trench surface area.

19 Claims, 8 Drawing Sheets

TOP VIEW

FIG. 7a

SIDE VIEW

TRENCH CHARGE-COUPLED DEVICE

This application is a continuation of application Ser. No. 461,607 filed on Jan. 5, 1990 now abandoned.

BACKGROUND OF THE INVENTION

1. Field of the Invention

The present invention relates to charge-coupled devices and more particularly, to the fabrication of a charge-coupled imaging device with a three-dimensional trench structure to achieve a high effective sensing and storage area with a small cell layout area.

2. Description of the Prior Art

The charge-coupled device (CCD) has become an increasingly important component of semiconductor technology. A CCD is a dynamic device which transports charge along a given predetermined path under the control of timed clock signals or pulses. Charge-coupled devices can be used in a variety of applications including memory applications, logic function applications, signal processing applications, image acquisition and image processing applications.

Figure 1:
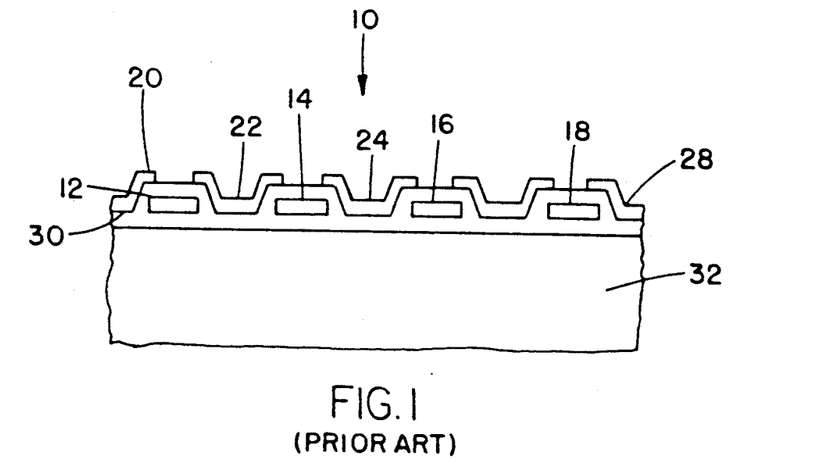
FIG. 1 is a cross-sectional view of a prior art CCD having a planar configuration.

FIG. 1 illustrates a conventional CCD 10 that is made by using an overlapping electrode gate structure. The CCD 10 includes alternating polycrystalline silicon electrodes 12, 14, 16, and 18 and polysilicon electrodes 20, 22, 24, 26 and 28, with a layer of silicon dioxide 30 interposed between the electrodes and a silicon substrate 32. The charge is stored and transferred along the semiconductor oxide interface, which is a two-dimensional surface parallel to the substrate.

For high resolution imagers employing the CCD, the CCD cell size, in terms of layout area, has to be scaled down to achieve high pixel count per unit imaging area in order to keep total chip area under a manageable size with a reasonable yield. As shown above, CCDs currently fabricated have a two-dimensional configuration, such that the charge storage capacity and the light sensitive area are directly proportional to the layout area of the CCD cell on the surface of the silicon substrate. Therefore, a high resolution CCD image is achieved at the expense of a smaller total charge storage capacity and light sensitivity because of the down scaling of the CCD cell layout area.

U.S. Pat. No. 4,234,887 to Vanderslice, Jr. discloses a technique for increasing the charge storage capacity per unit area of a CCD imaging device. The disclosed device includes a plurality of parallel V shaped grooves etched into a semiconductor substrate. The grooves are electrically isolated from each other by intervening strips of relatively thick field oxide. A plurality of isolated electrodes are provided orthogonally to the etched recesses such that a shift register structure is formed which extends along the length of each recess. In operation, the packets of charge are transferred by potential wells formed by the electrodes entirely within the grooves. The use of the sidewalls of the grooves to transfer charge results in a certain amount of area reduction. However, the V-grooved CCD has a fixed cross-sectional aspect ratio, as any increase of storage capacity is accompanied by an increase of the planar device area.

The use of a rectangular trench for transporting charge is shown in U.S. Pat. No. 4,760,273 in which a vertical charge transfer trench having an electrode formed therein is disclosed as part of a charge sweep device (CSD). The CSD is coupled to a conventional planar CCD. Also of interest are trench storage capacitors used in one-transistor DRAMs, in which charge is stored and read out from the same capacitor.

SUMMARY OF THE INVENTION

The present invention is directed to a charge-coupled imaging device comprising a plurality of trench electrode means in the surface of at least one cell of the charged-coupled device, and a plurality of surface electrodes on the surfaces of the charged-coupled device adjacent to the plurality of the trench electrode means thereby forming alternating trench electrode means and surface electrodes in the charged-coupled device cell. The trench electrode means are formed to maximize their 3-dimensional surface areas and to facilitate transport of charge along their sidewalls.

The trench CCD (TCCD) of the present invention provides for a high charge capacity CCD by utilizing three-dimensional CCD cells that extend the charge storage and light sensing area into the silicon substrate in which the trench electrodes are formed. The trench electrode means are comprised of one or more trenches etched into the silicon substrate and refilled with semiconductor electrode material. The layout area of the TCCD cell is of a multi-phase overlapping CCD cell, which includes a surface electrode as phase-1, a trench electrode adjacent thereto as phase-2, a second surface electrode as phase-3 adjacent the phase-2 trench electrode and a second trench electrode as phase-4 adjacent the second surface electrode. The trench CCD cell may be adapted for any valid clocking scheme, such as uniphase, 2-phase and 4-phase operation. In addition to the layout scheme, the shape of the trench plays an important role in determining the ease of charge transfer, as the bulk of the charge will transfer around the trench walls rather than around the bottom. It therefore may be desirable for certain applications to form each trench electrode means in the CCD cell with a plurality of trenches having particular shapes.

The TCCD of the present invention provides a CCD cell layout size the same as that of a conventional two-dimensional CCD cell, but with an increased charge capacity per CCD cell because of the larger areas of the potential wells. The increase in charge capacity means a larger signal-to-noise ratio and consequently a larger dynamic range. The increase in area is provided by the sidewalls of a single trench or by the multiple sidewalls of a plurality of trenches. In addition, for a given CCD cell layout size, sensitivity per unit area may be increased because of the increased light collecting area provided by the sidewalls. Furthermore, multiple reflections of light within the trench may increase the quantum efficiency of the cell.

The TCCD of the present invention may be easily manufactured since the trenches are formed by conventional etching and refill techniques. Cell layout design is compatible with conventional CCD cell layout, with the addition of one extra mask to define the trench. Thus, the trench CCD structure is applicable to all CCD designs including the time-delay-and-integration (TDI) charge-coupled device image scanner.

DETAILED DESCRIPTION OF THE INVENTION

The present invention is directed to a charge-coupled device with a three-dimensional trench structure that achieves a highly effective sensing and storage area in a CCD imager while maintaining a small cell layout area. The layout of the trench CCD cell is comprised of a plurality of trench electrodes etched in the surface of a semiconductor material and a plurality of surface electrodes on the surface of the semiconductor adjacent the trench electrodes to form alternating trench electrodes and surface electrodes. A gate oxide layer is disposed between the electrodes and the semiconductor underlayer. In the trench CCD of the present invention, the charge storage area is a three-dimensional surface that extends into the bulk semiconductor. The trenches are formed to maximize the three-dimensional charge storing surface without increasing the surface area parallel to the chip surface and to facilitate transport of charge along the sidewalls of the trenches. The trench CCD of the invention provides increased charge storage area over the prior art two-dimensional planar CCD.

Figure 2:
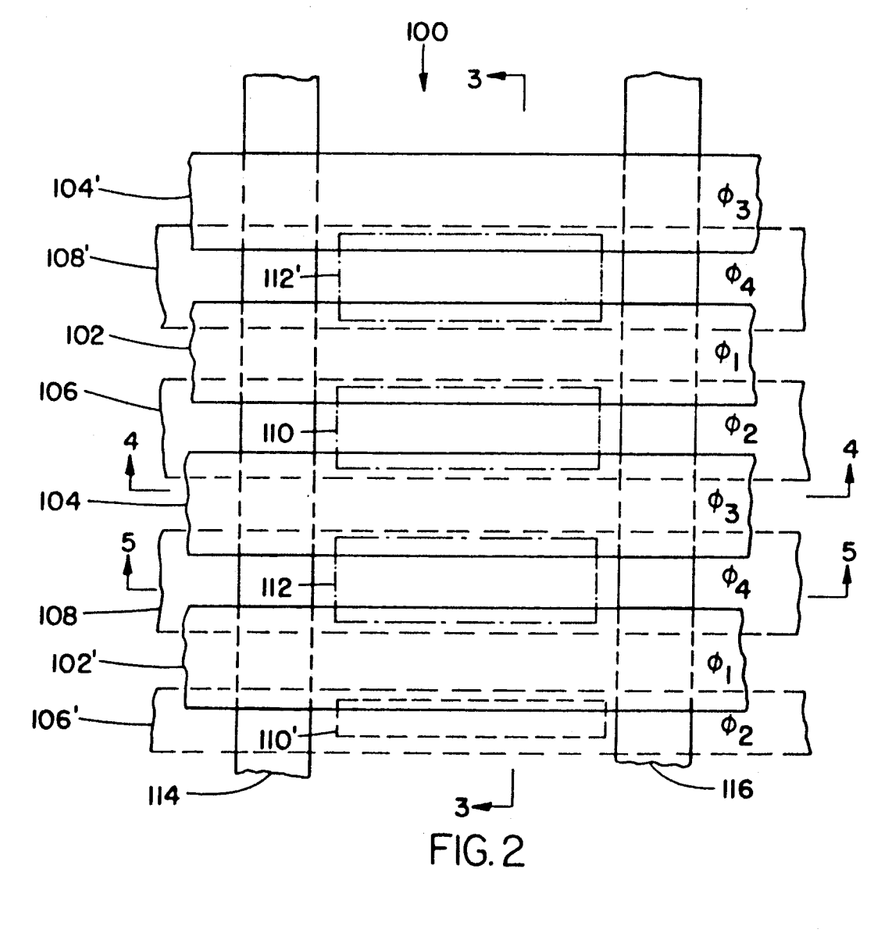
FIG. 2 is a top view of the layout of the trench CCD cell of the present invention.
Figure 4:
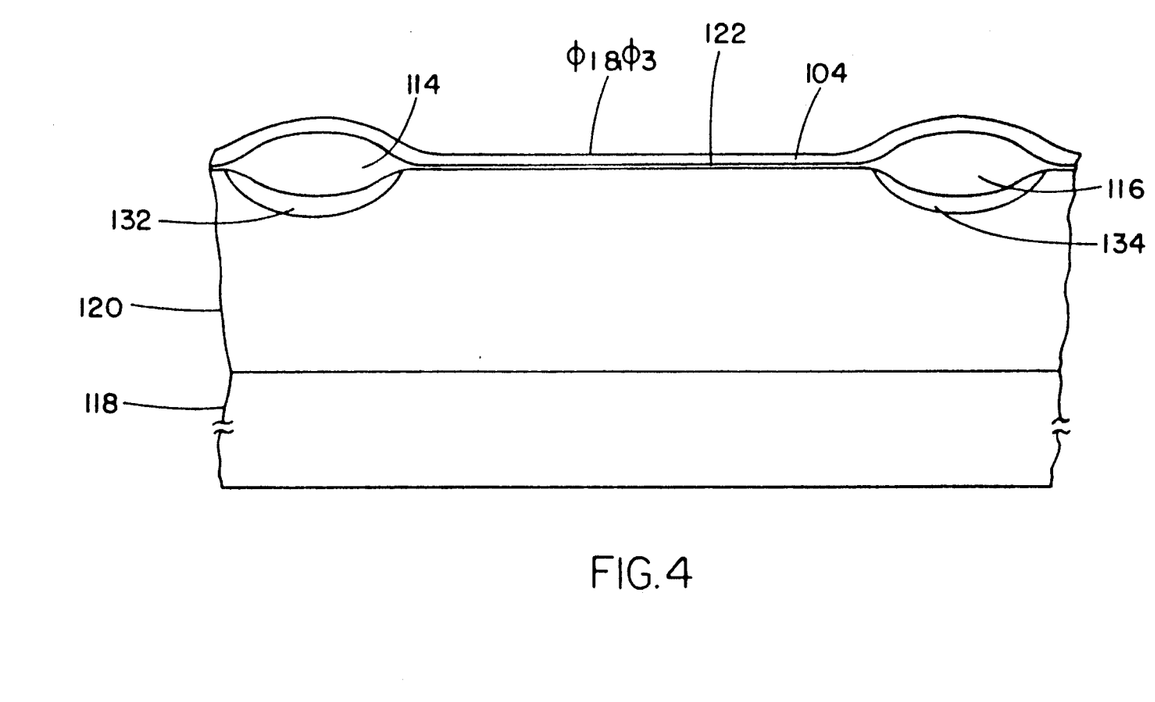
FIG. 4 is a cross-sectional view of the trench CCD cell of the present invention along section line 4—4 of FIG. 2.

Referring now to the drawings, FIG. 2 shows a top view, also knowm as the layout view of a trench CCD 100 of the present invention. A CCD imager comprises a large number of cells, each of which represents a single pixel of the image. Each TCCD cell consists of four electrodes that can be used to implement any one of a uni-phase, 2-phase and 4-phase clocking scheme. The CCD device 100 of FIG. 2 is shown with a 4-phase overlapping electrode configuration having alternating trench and surface electrodes. The device 100 includes surface electrodes 102, 102', 104 and 104' formed on the surface of the device. In addition, the device 100 includes trench electrodes 106 and 106', formed in trenches 110, 110' and trench electrodes 108 and 108' formed in trenches 112 and 112'. Also shown in FIG. 4 are two regions of recessed field oxide 114 and 116 for isolating columns of CCD cells by preventing charge from drifting or diffusing into adjacent columns of cells. The portion of the device 100 in FIG. 2 shows one entire CCD cell formed by surface electrodes 102 and 104 and trench electrodes 106 and 108. Surface electrodes 102' and 104' and trench electrodes 106' and 108' form portions of adjacent cells. The number of TCCD cells will correspond to the number of pixels in the imaging device.

Figure 3:
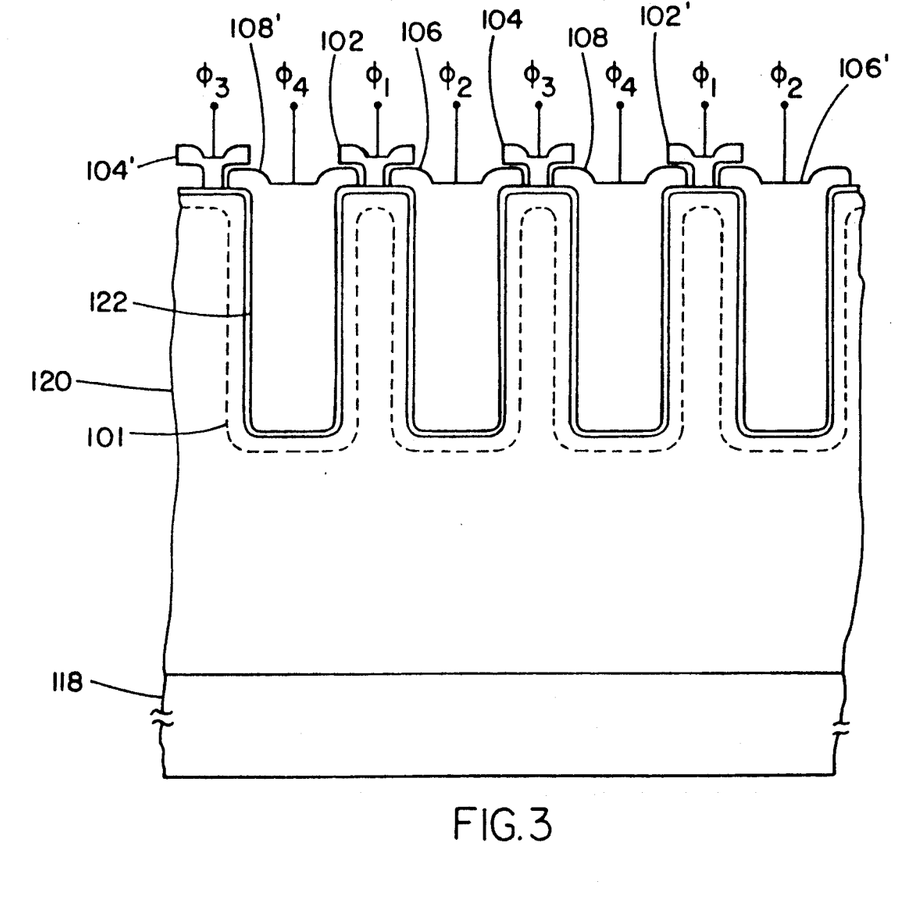
FIG. 3 is a cross-sectional view of the trench CCD cell of the present invention along section line 3—3 of FIG. 2.

Referring now to FIG. 3, there is shown a cross-sectional view of the TCCD 100 of FIG. 2 along section line 3—3. The device 100 includes a silicon substrate 118 on which is formed a layer 120 of silicon. The layer 120 of the TCCD 100 is an epitaxial layer grown onto the semiconductor substrate 118 by any suitable process, such as by molecular beam epitaxy or chemical vapor deposition. The trench electrodes 106, 106' 108 and 108' are formed by creating trenches in the silicon layer 120. The trenches can be formed by masking and etching, such as, by reactive-ion-etching, or any other well known technique. Typical trench depths are 6 um. Once the trenches are etched out, a thin gate oxide 122 is grown over the trenches and the top surface of the epitaxial layer 120. The gate oxide 122 follows the contour of the trenches and forms a very thin layer thereon. The typical gate oxide 122 used is silicon dioxide, however, other suitable insulators may also be used.

After the gate oxide 122 is formed over the trenches and the top surface of the substrate, the trenches are refilled with doped polysilicon to provide trench electrodes 106, 106', 108 and 108'. For the purpose of this illustration, trench electrodes 106 and 106' are designated as the phase-2 ($\phi_2$) electrodes and trench electrodes 108 and 108' are designated as the phase-4 ($\phi_4$) electrodes. After the trench electrodes are formed, the trench electrodes are patterned by masking and etching. Then the gate oxide under the surface electrodes is etched and re-grown. Thereafter, a layer of polysilicon is deposited to form the surface electrodes 102, 102', 104 and 104' by well known photolithographic techniques. The surface electrodes 102 and 102' are designated the phase-1 ($\phi_1$) electrodes and surface electrodes 104 and 104' are designated the phase-3 ($\phi_3$) electrodes. As is shown in FIG. 3, the electrodes 102, 102', 104, 104' overlap adjacent electrodes 106, 106', 108 and 108' to provide coupling between adjacent potential wells.

The polysilicon refilled trenches 106, 106', 108 and 108' are typically doped n-type and preferably have a low resistivity of less than 20 ohms per square. The surface electrodes 102, 102', 104 and 104' are typically doped n-type and also preferably have a low resistivity of less than 20 ohms per square. The epitaxial layer 120 is p-type silicon and the substrate 118 is heavily doped p-type silicon. An opposite doping scheme in which n and p type are interchanged may be used, however, the doping scheme shown in FIG. 3 is the more widely accepted scheme. In addition, semiconductor materials other than silicon can be utilized, such as germanium.

Referring now to FIG. 4, there is shown a cross-sectional view of the TCCD 100 along section lines 4—4 of FIG. 2. FIG. 4 illustrates a sectional view of the phase-3 surface electrode 104. The gate oxide 122 is shown on the surface of the epitaxial layer 120 and crossing over to the recessed field oxide regions 114 and 116. The recessed field oxide regions 114 and 116 are formed by well-known local oxidation of silicon techniques to block charges from intercell leakage. In addition, heavily doped p-type material sections 132 and 134 are formed directly under the recessed field oxide regions 114 and 116. The heavily doped p-type sections 132 and 134 are commonly known as channel stops and functionally aid in creating a potential barrier to block stray charges.

Figure 5:
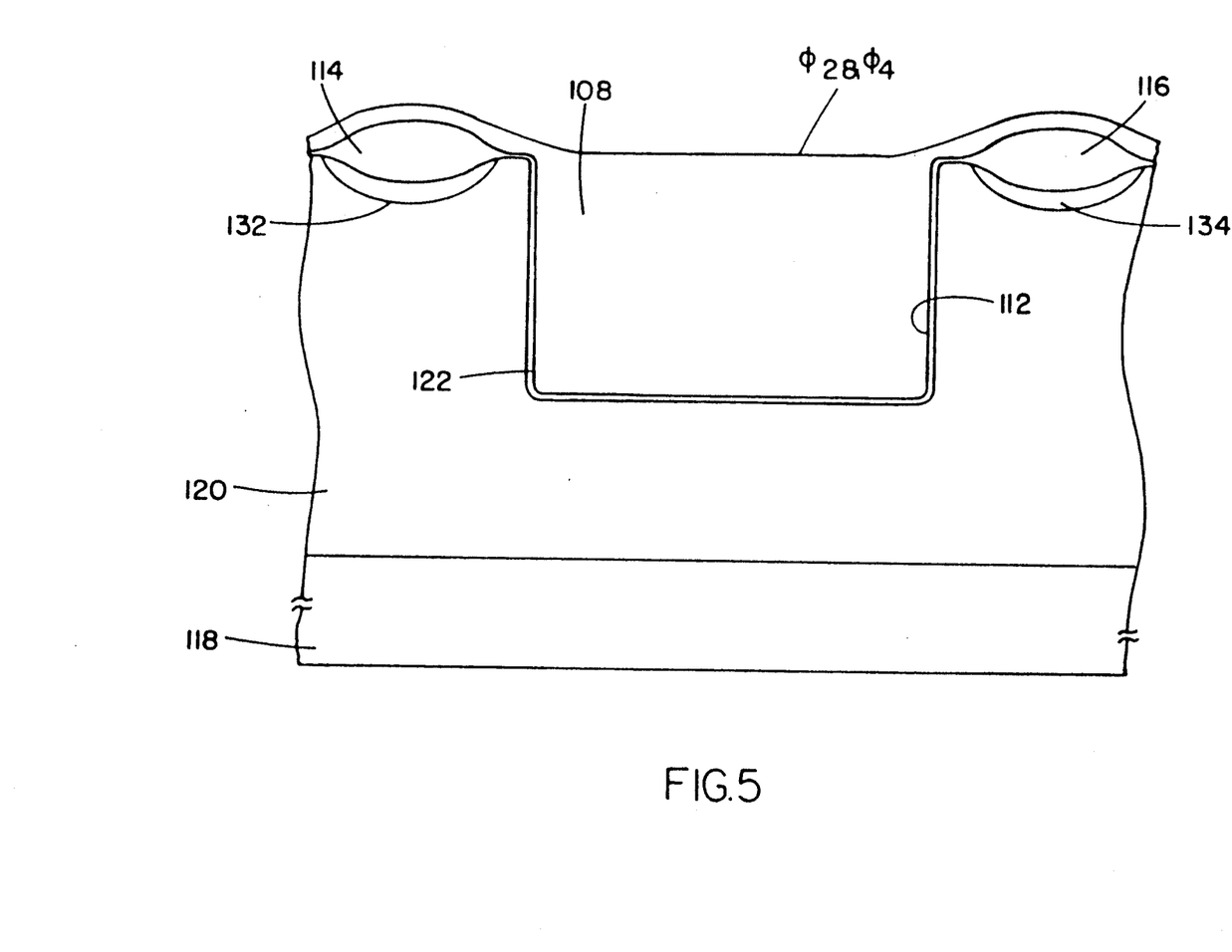
FIG. 5 is a cross-sectional view of the trench CCD cell of the present invention along section line 5—5 of FIG. 4.

Turning now to FIG. 5, there is shown a cross-sectional view of the TCCD 100 along section line 5—5 of FIG. 2. FIG. 5 illustrates a sectional view of the phase-4 trench electrode 108 and trench 112 orthogonal to the view thereof as seen in FIG. 2.

As was stated above, the trench CCD of the invention provides increased charge capacity per CCD cell. The increase in the charge storage area is provided by the sidewalls of the trenches. For a given rectangular shaped trench defined by width W, length L, and depth D, the effective cell area for charge collection and storage is approximately increased by $2 \times (W \times D + L \times D)$, as compared to a conventional two-dimensional CCD cell. The width, length and depth of the trenches can be adjusted to maximize their surface areas. Thus, the TCCD allows the three-dimensional charge storing surface to be maximized without increasing the surface area parallel to the chip surface.

Figure 6:
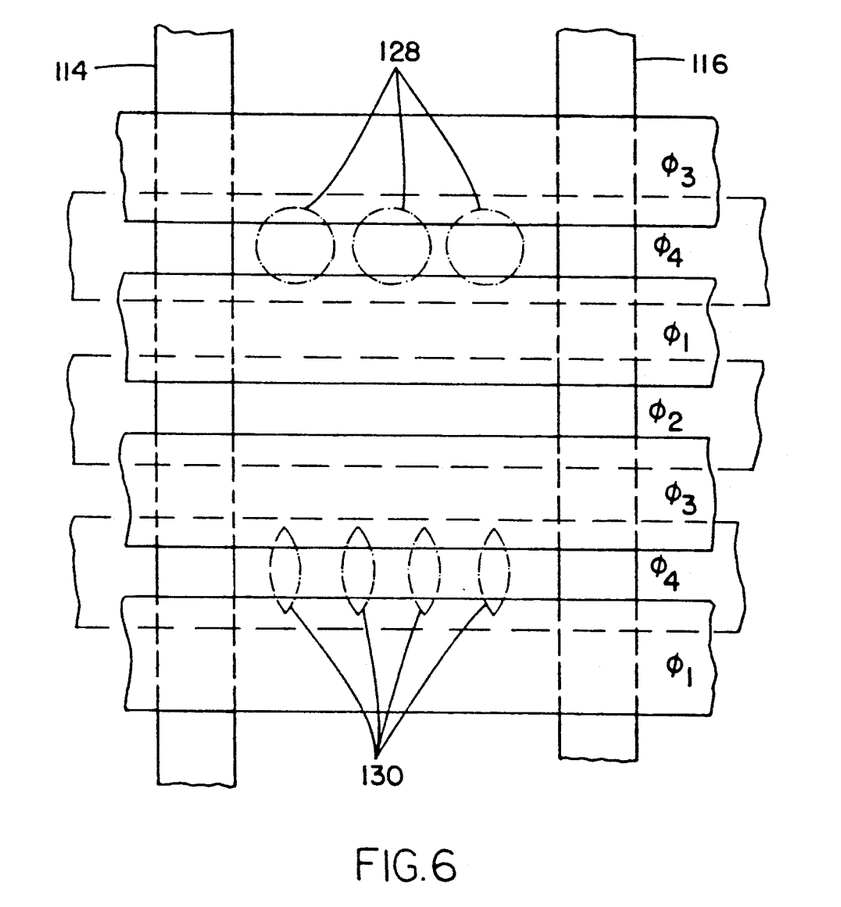
FIG. 6 is a top view of the layout of the trench CCD cell of the present invention utilizing various shaped trenches.

Another technique for maximizing the surface area is to utilize different configurations for the trenches. In order to maximize the effective cell area, the perimeter of the top surface of the trench has to be maximized. The trench electrodes shown in FIGS. 2-5 are formed in a single rectangular shaped trench. As will be described in more detail below, the change transfer takes place around the sidewalls of the trench, rather than around the bottom. In view of this fact, it may be desirable to form the electrodes with multiple trenches, instead of one large trench. FIG. 6 illustrates cylindrically shaped trenches with circular cross-section 128 and cylindrically shaped trenches with elliptical cross-section 130 as two possible configurations. However, other configurations may be utilized, such as a trapezoidal cross-section. The multiple trench electrodes will provide more sidewall area to increase charge storage and transfer efficiency.

Figure 7A:
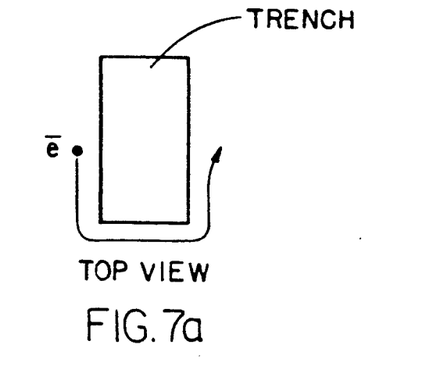
FIGS. 7a and 7b are diagrammatic representations of the transfer of charge from one electrode to the next in the trench CCD cell of the present invention along the sidewall of the trench.
Figure 7B:
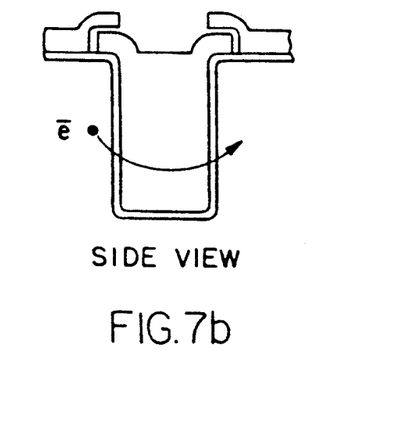

In operation, the TCCD stores and transfers charge along the Si/SiO$_2$ interface. Referring back to FIG. 3, there is shown an equipotential line 101 that follows the contour of the Si/SiO$_2$ interface when all the electrodes are biased at the same potential. When potentials are applied to the various electrodes, charge is supplied to the polysilicon refilled trenches. The gate oxide layer 122 is an insulator and acts as the dielectric of a capacitor. Thus, the charge in the polysilicon trenches induces a potential well in the p-type layer 120 for collecting charge (e.g. charge generated by incident photons) via the well-known field-effect. After the charge is collected, the charge is transferred by moving the carriers along the side-wall from one trench electrode through the adjacent surface electrode to the next trench electrode. The bulk of the charge will be transported around the sidewalls of the trench as shown in FIGS. 7a and 7b. Thus, the shape of the trench should be designed to facilitate transport of charge along the side-walls.

The trench CCD of the invention can operate in a four-phase clocking scheme, a two-phase clocking scheme and a uni-phase clocking scheme. A two-phase clocking scheme can be modified from a four-phase clocking scheme in a way similar to a conventional CCD by, for example, increasing the doping of the silicon under the surface electrodes, and thus forming potential barriers to create a directionality in the charge transfer. The techniques for creating directionality in charge transfer are well known in conventional CCD's and are directly applicable to the trench CCD.

The major consideration in choosing a clocking scheme for the trench CCD is that at any time, the majority of the stored charge should be stored under a trench electrode, not under a surface electrode if minimum cell layout area is to be maintained. This is necessary because the charge storage capacity of a surface electrode is much smaller than a trench electrode, and if all the stored charge is dumped to the potential pocket or well under the surface electrode, signal charge will spill over and as a consequence charge loss will occur. To maintain minimum cell layout area, the surface electrodes can only act as transfer and blocking electrodes, not storage electrodes. The choice of clocking scheme will depend on the particular application for which the TCCD is employed.

Figure 8A:
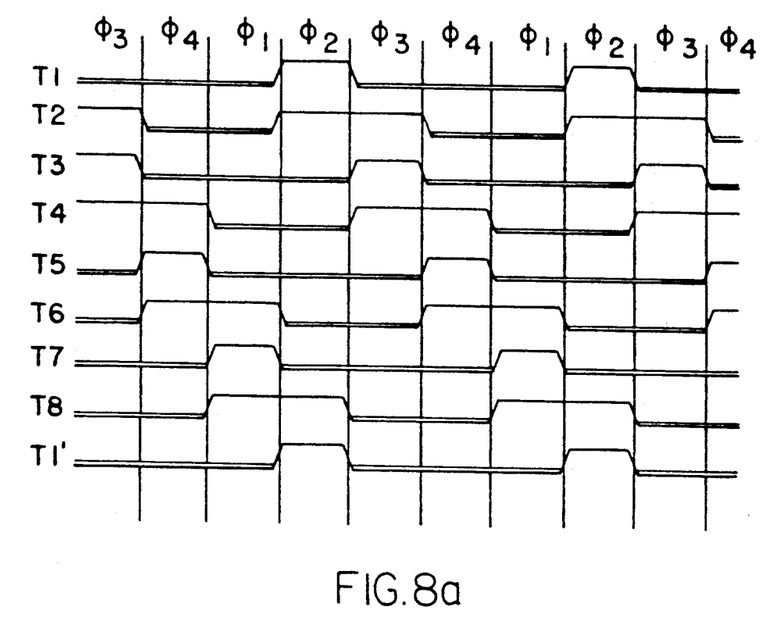
FIG. 8a is a potential well diagram for a four-phase clocking scheme utilized by the trench CCD of the present invention.
Figure 8B:
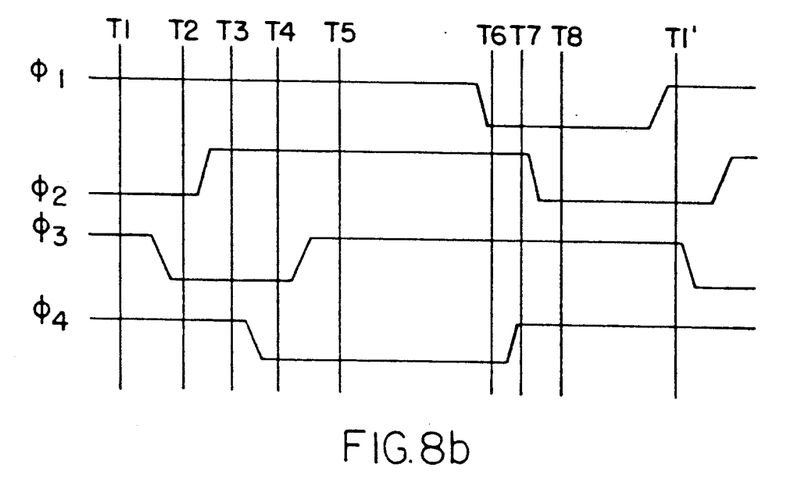
FIG. 8b is a timing diagram for a four-phase non-overlapping clocking scheme for the trench CCD of the present invention.

An illustrative clocking scheme for a four-phase TCCD is shown in FIGS. 8a and 8b. During time period $t_1$, a high positive voltage potential $V_H$, is applied to the phase-1, phase-3 and phase-4 electrodes causing a potential well to be created under these electrodes and a low potential $V_L$ ($V_H > V_L$) is applied to the phase-2 electrodes. Since there is a low potential on the phase-2 electrodes, there is a potential barrier under the electrodes. At time period $t_2$, the voltage potential on the phase-1 and phase-4 electrodes remains constant while the voltage potential on the phase-3 electrodes is dropped to $V_L$, thereby collapsing the potential well under the phase-3 electrode and pushing the charge previously stored under phase-3, phase-4, and phase-1, to be stored under phase-4 and phase-1 only. The voltage potential on the phase-2 electrode remains the same as it was at time period $t_1$. At time period $t_3$, the voltage potential on the phase-1 and phase-4 electrodes remains at the high level while the potential on phase-2 is raised to $V_H$ (high) thereby creating a potential well under the phase-2 electrode to receive the charge from the potential well under phase-4 electrode and phase-1 electrode. The potential on the phase-3 electrode remains low. Thus, the charge is being transferred from one electrode to the next on sucessive time pulses.

At time period $t_4$, the voltage potential is high for the phase-1 and phase-2 electrodes, while the phase-3 and phase-4 electrodes are at a low potential value. This results in the phase-1 and the phase-2 electrodes having a potential well while the phase-3 and the phase-4 electrodes have a potential barrier. The process continues as shown in FIGS. 8a and 8b through time period $t_1$ which is the point where the process begins over.

While the invention has been particularly shown and described with respect to the preferred embodiments thereof, it should be understood by those skilled in the art that the foregoing and other changes in form and details may be made therein without departing from the spirit and scope of the invention which should be limited only by the scope of the appended claims.

Having thus described the invention, what is claimed as new and desired to be secured by Letters Patent is:

1. A charge-coupled imaging device, including a light-sensitive semiconductor layer accommodating an array of cells for producing image signals, comprising:
   isolation means, in a surface of said semiconductor layer, for creating two parallel boundaries of the cells of said array and defining a charge transfer channel;
   at least one cell of said array having at least two three-dimensional charge storing surfaces separated from and located between said two boundaries in said channel, said charge storing surfaces having at least one sidewall arranged substantially perpendicular to said surface of said semiconductor layer;

a plurality of trench electrode means for forming a respective electrode in each three dimensional charge storing surface of said at least one cell of said device, said plurality of trench electrode means and said charge storing surfaces being formed to maximize the three dimensional surface areas of the charge storing surfaces and oriented between said two boundaries across said channel to facilitate transport of charge along the sidewalls of said charge storing surfaces; and a plurality of parallel surface electrodes on the surfaces of said device oriented substantially perpendicular to said two parallel boundaries and adjacent said plurality of trench electrode means to form alternating trench electrode means and surface electrodes on said device for applying a potential to create a charge carrier flow in said channel in a direction generally parallel to the surface of said semiconductor layer and said two boundaries through a potential well induced by said surface electrodes in said semiconductor layer surface and along the walls of said charge storing surfaces.

2. The charge-coupled imaging device of claim 1 further comprising a semiconductor substrate, said surface electrode being formed on a surface of said substrate and said plurality of trench electrode means being formed within said substrate, and an insulation means disposed between said plurality of trench electrode means and said substrate and between said plurality of surface electrodes and said substrate.

3. The charge-coupled imaging device of claim 1 wherein said alternating trench electrode means and surface electrodes are arranged in an overlapping electrode configuration.

4. The charge-coupled imaging device of claim 1 wherein each of said plurality of trench electrode means comprises a single trench formed in the surface of said device.

5. The charge-coupled imaging device of claim 1 wherein each of said plurality of trench electrode means comprises a plurality of trench electrodes formed in the surface of said device.

6. The charge-coupled imaging device of claim 2 wherein each of said plurality of trench electrode means is comprised of a trench etched in the surface of said substrate, said trench being refilled with conductive semiconductor material.

7. The charge-coupled imaging device of claim 6 wherein said conductive semiconductor material is polysilicon.

8. The charge-coupled imaging device of claim 6 wherein said trenches have a rectangularly shaped perimeter at the surface of said substrate.

9. The charge-coupled imaging device of claim 6 wherein said trenches have a circularly shaped perimeter at the surface of said substrate.

10. The charge-coupled imaging device of claim 6 wherein said trenches have a elliptically shaped perimeter at the surface of said substrate.

11. The charge-coupled imaging device of claim 1 wherein said plurality of surface electrodes are formed of a conductive semiconductor material.

12. The charge-coupled imaging device of claim 11 wherein said conductive semiconductor material is polysilicon.

13. The charge-coupled imaging device of claim 2 wherein said insulation means is a layer of silicon dioxide.

14. The charge-coupled imaging device of claim 1 wherein said at least one cell of said device includes said alternating trench electrode means and surface electrodes arranged in an overlapping electrode configuration wherein during clocked transfer of charges through the charge-coupled imaging device, adjacent trench electrode means function respectively as a storage electrode and a receiving electrode and adjacent surface electrodes function respectively as a transfer electrode and a blocking electrode.

15. The charge-coupled imaging device of claim 14 wherein said storage, receiving, transfer and blocking electrodes can be used in clocking operations of any one of a 4-phase, 2-phase or 1-phase clocking operation.

16. A CCD array of cells, for producing image signals, disposed in a light-sensitive semiconductor layer and comprising:

isolation means in said semiconductor layer, for defining two parallel boundaries of each cell in said array and defining a charge transfer channel;

at least two three-dimensional capacitors in said channel, separated from and located between said two boundaries in at least one of said cells, said capacitors having a vertical dimension substantially perpendicular to the surface of said semiconductor layer;

electrode means for forming an electrode in each three-dimensional capacitor of said at least one of said cells, said electrode means and said capacitors being formed to maximize the three-dimensional surface areas of the three-dimensional capacitors and oriented between said two boundaries across said channel to facilitate transport of charge along the sidewalls of said capacitors; and transfer means for moving charge carriers in a flow along said channel between said cells in a direction generally parallel to said two boundaries and said surface of said layer and along said surface and the sidewalls of said capacitors, wherein said transfer means comprises a plurality of parallel surface electrodes on the surface of said layer between each cell and oriented substantially perpendicular to said two parallel boundaries and adjacent said capacitors to form, with said electrode means, alternating electrodes for applying a potential to create said charge carrier flow in said channel through the potential well induced by said surface electrodes in said semiconductor layer surface.

17. A CCD array of cells as in claim 16 wherein said three-dimensional capacitors extend into said layer.

18. A CCD array of cells as in claim 16 wherein said electrode means comprise transparent electrodes located in said three-dimensional capacitors.

19. A CCD array of cells as in claim 18 wherein at least a portion of said transparent electrodes overlap said layer.

* * * * *